(12) United States Patent
Kippes et al.

(10) Patent No.: US 11,239,398 B2
(45) Date of Patent: Feb. 1, 2022

(54) OPTOELECTRONIC SEMICONDUCTOR COMPONENT AND BIOMETRIC SENSOR

(71) Applicant: OSRAM OLED GmbH, Regensburg (DE)

(72) Inventors: Thomas Kippes, Neumarkt (DE); Claus Jaeger, Regensburg (DE); Jason Rajakumaran, Cork (IE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/638,142

(22) PCT Filed: Jul. 26, 2018

(86) PCT No.: PCT/EP2018/070324
§ 371 (c)(1),
(2) Date: Feb. 11, 2020

(87) PCT Pub. No.: WO2019/030008
PCT Pub. Date: Feb. 14, 2019

(65) Prior Publication Data
US 2020/0251631 A1  Aug. 6, 2020

(30) Foreign Application Priority Data

Aug. 11, 2017 (DE) ............ 10 2017 118 396.5
Sep. 28, 2017 (DE) ............ 10 2017 122 616.8
Dec. 20, 2017 (DE) ............ 10 2017 130 779.6

(51) Int. Cl.
  *H01L 33/58* (2010.01)
  *G06K 9/00* (2006.01)
(52) U.S. Cl.
  CPC ........ *H01L 33/58* (2013.01); *G06K 9/00604* (2013.01)

(58) Field of Classification Search
  CPC ........ H01L 27/14649–14652; H01L 27/14634
  See application file for complete search history.

(56) References Cited

U.S. PATENT DOCUMENTS

| 4,698,730 A | 10/1987 | Sakai et al. |
| 8,465,180 B2 | 6/2013 | Van Oers et al. |
| 2004/0207999 A1 | 10/2004 | Suehiro et al. |
| 2006/0034084 A1* | 2/2006 | Matsuura ............. H01L 33/507 362/293 |

(Continued)

FOREIGN PATENT DOCUMENTS

| DE | 102011113483 A1 | 3/2013 |
| DE | 102015100329 A1 | 7/2016 |

(Continued)

OTHER PUBLICATIONS

Parts list detailing parts being published as of Mar. 30, 2015 as archived in the wayback machine archival system at https://web.archive.org/web/20150330014901/http://www.roithner-laser.com/led_diverse.html which is available online (Year: 2015).*

(Continued)

*Primary Examiner* — Grant S Withers
(74) *Attorney, Agent, or Firm* — Viering, Jentschura & Partner MbB

(57) ABSTRACT

An optoelectronic semiconductor component may include at least one optoelectronic semiconductor chip, a reflector, a lens, and a connecting layer. The reflector may have a reflector recess where the semiconductor chip may be arranged. The lens may be fully located in the reflector recess, and the lens may have a lens recess. The connecting layer may fasten the lens on the reflector. The lens may have a lens outer side facing toward a reflector inner wall of the reflector recess. A gap may be between the reflector and the lens, and the gap may be filled only partially with the connecting layer. The semiconductor chip may not touch the lens. The optoelectronic semiconductor component may be incorporated into a biometric sensor.

24 Claims, 10 Drawing Sheets

(56) References Cited

U.S. PATENT DOCUMENTS

| | | | |
|---|---|---|---|
| 2007/0085103 A1* | 4/2007 | Nishioka | H01L 33/58 257/99 |
| 2011/0248304 A1* | 10/2011 | Ichikawa | H01L 33/505 257/98 |
| 2012/0068615 A1 | 3/2012 | Duong et al. | |
| 2013/0214298 A1* | 8/2013 | Lin | H01L 33/60 257/88 |
| 2014/0225147 A1 | 8/2014 | Halbritter et al. | |
| 2015/0036114 A1 | 2/2015 | Schadt et al. | |
| 2015/0227790 A1 | 8/2015 | Smits | |
| 2016/0080589 A1 | 3/2016 | Talwerdi | |
| 2018/0026167 A1 | 1/2018 | Eckert et al. | |
| 2018/0103857 A1 | 4/2018 | Hirmer et al. | |
| 2018/0164559 A1 | 6/2018 | Jaeger | |

FOREIGN PATENT DOCUMENTS

| | | |
|---|---|---|
| DE | 102015104312 A1 | 9/2016 |
| DE | 102015108499 A1 | 12/2016 |
| EP | 1691425 A1 | 8/2006 |
| EP | 3002621 A1 | 4/2016 |
| JP | 2011181550 A | 9/2011 |
| WO | 2017156189 A1 | 9/2017 |

OTHER PUBLICATIONS

Agarwal, T. blog post for EDGEFX "New Infrared (IR) LED for Biometric IC Applications" available via the wayback machine archive at http://web.archive.org/web/20170406023848/https://www.edgefxkits.com/blog/infrared-ir-led-biometric-id-applications/ published online as of Apr. 6, 2017 (Year: 2017).*

German Search Report based on Application No. 10 2017 130 779.6, dated Feb. 26, 2018, 13 pages (for reference purpose only).

International Search Report based on Application No. PCT/EP2018/070324, dated Oct. 10, 2018, 15 pages (for reference purpose only).

* cited by examiner

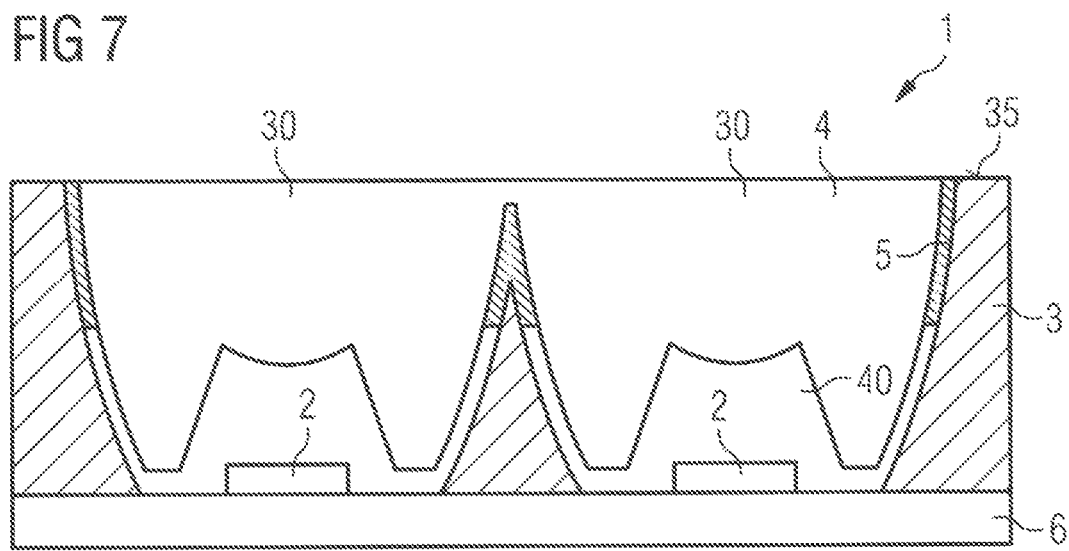
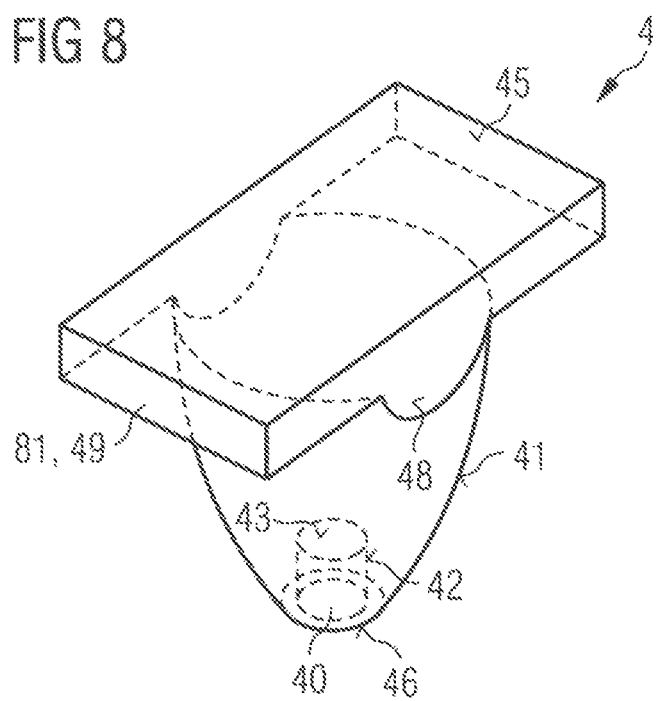

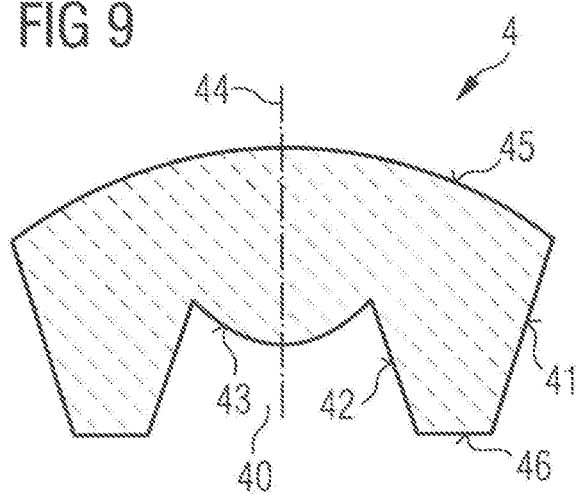
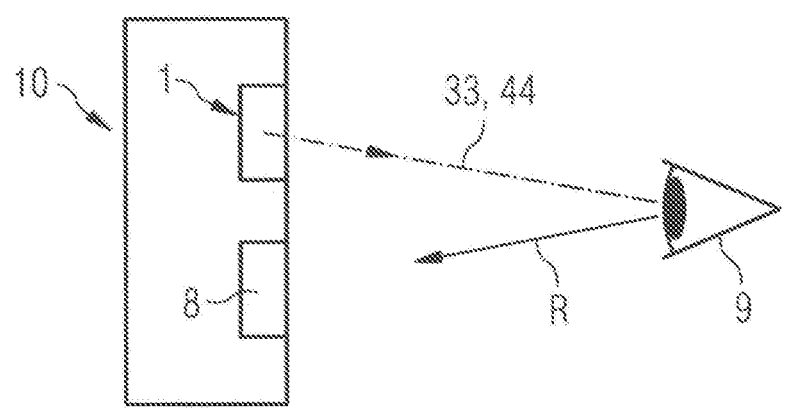

OPTOELECTRONIC SEMICONDUCTOR COMPONENT AND BIOMETRIC SENSOR

CROSS-REFERENCE TO RELATED APPLICATIONS

The present application is a national stage entry according to 35 U.S.C. § 371 of PCT application No.: PCT/EP2018/070324 filed on Jul. 26, 2018; which claims priority to German application No. 10 2017 118 396.5, which was filed on Aug. 11, 2017, German application No.: 10 2017 122 616.8, which was filed on Sep. 28, 2017, and German application no. 10 2017 130 779.6, which was filed on Dec. 20, 2017; all of which are incorporated herein by reference in their entirety and for all purposes.

TECHNICAL FIELD

An optoelectronic semiconductor component is provided. A biometric sensor, in particular an iris scanner, is furthermore provided.

BACKGROUND

An object to be achieved is to provide an optoelectronic semiconductor component which is compact and stable.

SUMMARY

According to at least one embodiment, the optoelectronic semiconductor component includes one or more optoelectronic semiconductor chips. The at least one optoelectronic semiconductor chip is adapted to generate radiation, for example to generate near-ultraviolet radiation, visible light and/or near-infrared radiation. As an alternative, the semiconductor chip may also be a detector chip for detecting radiation, for example a single-channel detector chip or a pixelated multichannel detector chip. It is furthermore possible for radiation-emitting and radiation-detecting semiconductor chips to be provided in combination with each other in the semiconductor component.

According to at least one embodiment, the optoelectronic semiconductor component includes a reflector. The reflector is adapted to reflect radiation which is emitted by the semiconductor chip and/or radiation which is to be detected by the semiconductor chip.

For example, the reflector includes a reflective coating, in particular consisting of one or more metals or of a sequence of layers with alternately high and low refractive indices, also referred to as a Bragg mirror. The reflective coating may be applied on a base body of the reflector. The base body is in particular, made of an injection-molded plastic. Besides injection molding, the base body may also be produced by other methods such as casting or replication molding.

According to at least one embodiment, the reflector includes one or more reflector recesses. The at least one semiconductor chip is placed in the at least one reflector recess. If there are a plurality of semiconductor chips and a plurality of reflector recesses, there may be a unique allocation between the reflector recesses and the semiconductor chips. As an alternative, a plurality of semiconductor chips configured identically or differently to one another may be introduced into a single reflector recess.

According to at least one embodiment, the semiconductor component contains one or more lenses. The at least one lens is located partially or fully in the reflector recess. This means that the lens does not protrude beyond the reflector recess.

According to at least one embodiment, the lens includes one or more lens recesses. The semiconductor chip is applied in or on the at least one reflector recess. If there are a plurality of lens recesses, then, as for the reflector recesses, there is a unique allocation between the lens recesses and the semiconductor chips. As an alternative, a plurality of semiconductor chips, in particular semiconductor chips of the same type, are assigned to a single lens recess.

That the semiconductor chip, or at least one of the semiconductor chips, is located in the lens recesses means, for example, that the lens recess fully covers the assigned semiconductor chip as seen in plan view and/or that the assigned semiconductor chip is intersected by fictitious connecting lines between two bounding surfaces of the lens as seen in cross section. That the semiconductor chip is located on the lens recess means, for example, that the lens recess fully or partially covers the assigned semiconductor chip as seen in plan view and/or that a maximum distance between the semiconductor chip and the lens inner wall is at most 0.3 mm or 0.2 mm or 0.1 mm, and/or that a maximum distance between the semiconductor chip and the lens along the optical axis is at most 0.3 mm or 0.2 mm or 0.1 mm.

According to at least one embodiment, the semiconductor component includes a connecting means such as an adhesive, for example silicone-based or based on an epoxy resin, or such as a cover plate which covers the lens and the reflector together. The lens is fastened, such as fastened irreversibly, on the reflector by means of the connecting means. This means that because of the connecting means, the lens does not become detached from the reflector, during intended use. In particular, the lens cannot be removed from the reflector nondestructively and/or without a tool.

According to at least one embodiment, the lens includes a lens outer side. Furthermore, the reflector includes a reflector inner wall, the reflector inner wall representing a bounding surface of the reflector recess. In this case, the lens outer side faces toward the reflector inner wall. In a non-limiting embodiment, the reflector inner wall and the lens outer side do not touch in this case. This means that there is a distance, in particular continuously, between the reflector inner wall and the lens outer side.

According to at least one embodiment, the connecting means is located partially or fully between the reflector inner wall and the lens outer side. This means that the distance between the reflector inner wall and the lens outer side is maintained and/or adjustable by means of the connecting means. As an alternative, the connecting means may be located partially or fully outside the reflector recess.

According to at least one embodiment, the at least one optoelectronic semiconductor chip does not touch the lens. This means that the lens is not in direct physical contact with the semiconductor chip. The semiconductor chip is therefore arranged separated from the lens.

According to at least one embodiment, a gap between the reflector and the lens is filled only partially with the connecting means. For example, as seen in cross section, and along a longitudinal extent of the gap, the connecting means fills the gap only to at most 50% or 30% or 20%, such as to at most 15% or 10% or 5%. In areas of the gap that are not filled with the connecting means, the gap has a total internal reflection effect. The gap is therefore filled precisely in a proportion such that sufficient mechanical stability is achieved but a proportion of radiation that is as high as possible is totally internally reflected.

In at least one embodiment, the optoelectronic semiconductor component includes at least one optoelectronic semiconductor chip as well as a reflector having a reflector recess, in which the at least one semiconductor chip is applied. A lens is at least partly located in the reflector recess. The lens includes a lens recess, in or on which the at least one semiconductor chip is applied. The lens is fastened on the reflector by a connecting means. The lens includes a lens outer side facing toward a reflector inner wall of the reflector recess. The connecting means is located at least partly between the reflector inner wall and the lens outer side. The lens does not touch the at least one optoelectronic semiconductor chip.

The semiconductor component specified may be manufactured compactly and is mechanically stable. In particular, the semiconductor component therefore has only a small installation space and emits only in a narrow emission angle range.

In conventional semiconductor components, a semiconductor chip is mounted on a carrier. Mounted on this carrier, there is a metal-coated reflector, on which a lens is subsequently adhesively bonded. The lens is generally adhesively bonded only at the four corners of the reflector and is raised over this reflector. The adhesively bonded lens is therefore highly susceptible to external force action, for example to being touched with tools, which may lead to failure of the semiconductor component during final assembly.

In the semiconductor component described, instead of a raised, externally adhesively bonded lens, a lens configured in particular for total internal reflection is adhesively bonded into the reflector. The lens is configured in such a way that it and the reflector fit into one another with a form fit and a large part, in the ideal case, 100% of the lens is recessed into the reflector. The reflector and the lens together form an optical element.

Because the lens is recessed into the reflector, the lens is almost inaccessible for external lateral force actions. Because of the form fit between the reflector and the lens, a quasi-monolithic optical element is formed. A gap between the reflector and the lens is, in particular, filled only partially with adhesive, i.e. the connecting means. A surface area available for the adhesive bonding and attachment of the lens on the reflector may therefore be increased significantly, so that the lens can be reliably anchored in the reflector. The optical element, composed of the reflector and the lens, may already be produced on a carrier before assembly. In this way, it is possible to save on an assembly step and therefore costs. With the optoelectronic semiconductor component described here, a structure is therefore provided which is robust in respect of detachment of the lens and which is compact.

In another aspect, an optoelectronic semiconductor component and the production thereof are provided, the semiconductor component containing an emitter for illumination tasks, for example for an iris scan, and at least one further emitter, optionally in addition also a detector, in particular for a distance measurement.

Conventionally, in the case of lenses based on the TIR principle, optionally also in combination with a reflector, for one or more emitters individual optics are provided for each emitter. TIR stands for total internal reflection.

In the present case, a TIR lens is used in the semiconductor component, different optical characteristics being achieved within one and the same lens. This is, for example, made possible by the combination of an LED light source and a laser such as a VCSEL as semiconductor chips of different types. VCSEL stands for vertical cavity surface emitting laser.

The functions "illumination", for example for an iris scan with a tilted emission characteristic, and "sensing", for example for a proximity of a body, for ambient light or for a light color, may therefore be combined within a single semiconductor component. Semiconductor components having a planar surface may furthermore be produced. A space saving by the combination of two emitters, which share common optics, may be achieved. The semiconductor component may therefore be constructed compactly.

Cost advantages are furthermore obtained in the production of the semiconductor component, in particular because of the combination of at least two emitters which share the lens, in comparison with the use of individual components. With the integration of a proximity sensor, further cost advantages may be achieved. Two or more emission characteristics may be produced with one lens inside a component. A current reduction at the system level is possible.

The emitters, i.e. the semiconductor chips, may emit the same wavelength or different wavelengths. Advantages may therefore be achieved in the industrial design of, for example, smart phones or tablets. A hole, perceived as distracting by the customer, in a cover may therefore be omitted. Semiconductor components having a proximity function with different ranges are furthermore possible. Thus, combination of an IRED for the iris scan with a short range (in particular less than 10 cm) proximity function may be carried out. This combination relocates the VCSEL from the otherwise separate proximity sensor into the IRED, i.e. the semiconductor component. A reduction of the required installation space may therefore be achieved and space may be provided for further functions or sensors, for example on smartphones.

Furthermore, a combination of an IRED for face recognition with a long range (in particular 0.5 m to 1 m) proximity function for the detection of objects in the recording range of the corresponding camera may be carried out. The camera and the IRED are turned on only when an object or a person is located in the recording range. Because of the substantially lower electricity consumption of a proximity sensor in comparison with IRED+ camera, with this approach electricity may be saved and the battery lifetime, which is important in mobile devices, may therefore be extended. Since the second semiconductor chip, in particular the VCSEL, is at a relatively large distance from the detector, optical crosstalk, for instance through a cover glass, is very small.

According to at least one embodiment, the gap has a constant width along its longitudinal extent, in particular as seen in cross section. This applies, in particular, with a tolerance of at most 30% or 15% of an average width of the gap. This means that because of the gap, a distance between the reflector and the lens is constant or almost constant along the lens outer side. This applies on the entire lens outer side or on at least 80% or 90% of the lens outer side. As an alternative or in addition, the width of the gap is also constant in the direction of the carrier, although there may be a different width in the direction of the carrier than between the reflector and the lens. Likewise, the gap in the direction of the carrier may also be omitted, so that the reflector may be seated on the carrier.

According to at least one embodiment, the lens and the connecting means include of a similar refractive index or the same refractive index. The effect achievable in this way is that radiation can be coupled without losses from the lens into the adhesive and reflected on the metallic reflector inner wall of the reflector. Similar refractive indices means that the refractive index of lens and the refractive index of the connecting means differ from one another by at most 0.2 or 0.1 or 0.05 or 0.02. This applies in particular for a maximum-intensity wavelength of radiation generated during operation of the semiconductor chip and at room temperature, i.e. 300 K. Similar or equal refractive indices may, for example, be achieved by the lens and the connecting means being based on the same material or on the same material system, for example in each case on a silicone or epoxy resin or an acrylic.

According to at least one embodiment, the connecting means covers the lens outer side to at most 50% or 30% or 20% or 10%. This means that a large part of the lens outer side is then free of the connecting means. These areas of the lens outer side which are free of the connecting means are partially or fully adapted for total internal reflection of radiation generated by the semiconductor chip during operation. This means that the reflector has no optical function in these areas which are free of the connecting means, and in these areas the generated radiation does not reach the reflector, or reaches the reflector only to a small extent.

According to at least one embodiment, in the areas covered by the connecting means, the lens outer side is configured for reflection, such as for specular reflection, of the radiation generated by the semiconductor chip during operation. This means that the generated radiation passes through the lens and through the connecting means to the reflector inner wall, and is reflected there back into the connecting means and through the lens, and is subsequently emitted from the semiconductor component on a lens upper side facing away from the semiconductor chip. The connecting means is therefore transparent for the radiation generated during operation.

According to at least one embodiment, the lens recess in which the semiconductor chip is located, is free of the connecting means. This also means that the semiconductor chip is separated from the connecting means and does not touch the connecting means. In particular, the connecting means also does not extend as far as the lens recess. Likewise, the connecting means may be separated from a carrier on which the semiconductor chip is applied.

According to at least one embodiment, an optical axis of the lens is arranged obliquely with respect to a mounting plane of the semiconductor chip. For example, an angle between the mounting plane and the optical axis is at most 88° or 86° or 84°. As an alternative or in addition, this angle is at least 45° or 60° or 75°. In other words, a main direction of the lens, and therefore of the semiconductor component, is arranged slightly tilted in relation to a mounting plane. The mounting plane may be oriented perpendicularly to a growth direction of a semiconductor layer sequence of the semiconductor chip.

According to at least one embodiment, the lens recess is shaped rotationally symmetrically about the optical axis of the lens. The same may apply for the lens outer side, in which case the lens may be cut obliquely with respect to the optical axis on a side facing away from the semiconductor chip. To this extent, the rotational symmetry about the optical axis of the lens may be interrupted on the lens upper side by the oblique cutting of the lens, in relation to the optical axis.

According to at least one embodiment, a bottom side of the lens is aligned perpendicularly to the optical axis of the lens. It is therefore possible for the bottom side to be aligned obliquely with respect to the mounting plane. The bottom side may fulfill an optical function, although it may also not be optically functionalized. This means that the optical effect of the lens may be generated only by the lens recess, the lens upper side and the lens outer side, without a significant influence of the bottom side.

According to at least one embodiment, the gap is formed wedge-shaped and/or triangularly as seen in cross section between the mounting side and the bottom side of the lens. This means that the bottom side does not then touch the mounting side, or touches it only in places.

According to at least one embodiment, the gap is a gas-filled gap, in particular an air gap or a gap filled with a protective gas such as nitrogen or argon, or alternatively with dried air. As an alternative, the gap may be evacuated, in which case there does not need to be a high-quality vacuum.

According to at least one embodiment, the bottom side is entirely separated from the carrier on which the semiconductor chips are applied. This means that the lens does not touch the carrier of the semiconductor chips and the mounting plane.

According to at least one embodiment, the lens side upper side, facing away from the mounting side, of the lens and a reflector upper side of the reflector are flush with one another. The reflector upper side and the lens upper side may respectively be shaped in a planar fashion, i.e. flat. As an alternative or in addition, it is possible for the reflector upper side and/or the lens upper side to extend parallel to the mounting plane.

According to at least one embodiment, the lens recess includes a frustoconical lens inner wall. An angle between the lens inner wall and the optical axis of the lens, as seen in cross section, is for example at least 2° or 5° and/or at most 20° or 12°. An average angle between the lens inner wall and the lens outer wall is, for example, at least 25° or 35° and/or at most 70° or 55°. This applies, in particular, for regions of the lens outer side which extend at most as far away from the mounting plane as the lens inner wall. This means that, when determining this average angle, regions of the lens outer side which lie further away from the mounting plane may be neglected.

According to at least one embodiment, the lens recess includes a top surface. The top surface faces toward the semiconductor chip. In particular, an optical axis of the semiconductor chip and/or a direction of maximum emission intensity of the semiconductor chip extends through the top surface, in particular centrally through the top surface. In order to reduce an emission angle, the top surface is curved convexly, i.e. shaped in a similar way to a converging lens.

According to at least one embodiment, a distance between the top surface and the semiconductor chip is at least 0.1 times or 0.3 times or 0.5 times or 0.7 times a diagonal length of the semiconductor chip. As an alternative or in addition, this distance is at most three times or two times or 1.5 times the diagonal length of the semiconductor chip. This distance is, in particular, determined along the optical axis of the lens and/or of the semiconductor chip. The diagonal length is, in particular, the length of a diagonal of a main radiation side of the semiconductor chip parallel to the mounting side.

According to at least one embodiment, the lens is shaped asymmetrically as seen in plan view. In this case, the lens has a greatest extent along a longitudinal axis and a smallest extent along a transverse axis. The longitudinal axis may be oriented perpendicularly to the transverse axis. A ratio of the greatest extent and the smallest extent is at least 1.05 or 1.1 and/or at most 5 or 3 or 1.5 or 1.3. In other words, the extents along the longitudinal axis and along the transverse axis do not differ very greatly from one another.

According to at least one embodiment, the lens includes planar lens side surfaces on a side facing away from the semiconductor chip, in particular away from the lens upper side. The lens side surfaces are oriented parallel to the optical axis of the lens. In a non-limiting embodiment, the lens side surfaces are also aligned parallel with the longitudinal axis.

According to at least one embodiment, the lens side surfaces are round as seen in side view and widen in the direction away from the semiconductor chip. In particular, edges of the lens side surfaces are shaped parabolically or hyperbolically. An edge, facing away from the semiconductor chip, of the lens side surfaces extends in a straight line, in particular parallel to the mounting plane.

According to at least one embodiment, a plurality of semiconductor chips are applied in the reflector recess. In this case, precisely one lens is provided. The lens includes a plurality of lens recesses, and the lens recesses are assigned uniquely to the semiconductor chips.

According to at least one embodiment, the lens includes a lens plateau on a side facing away from the semiconductor chip.

The lens plateau has a polygonal configuration, for example a rectangular, square or hexagonal configuration, as seen in plan view. The lens plateau is adapted to anchor the lens to the reflector. In particular, the lens plateau is formed from regions of the lens on the lens upper side which extend in a direction away from the optical axis of the lens in relation to the lens outer side. The lens plateau is aligned parallel with the mounting plane. For example, the lens plateau is configured as a plane-parallel plate or a protuberance out from the lens outer side on the lens upper side.

According to at least one embodiment, the semiconductor chip is adapted to emit radiation having a maximum-intensity wavelength of at least 750 nm or 800 nm. As an alternative or in addition, the maximum-intensity wavelength is at most 1.1 µm or 980 nm or 850 mm. This means that the semiconductor chip can emit near-infrared radiation. As an alternative, the maximum-intensity wavelength is at least 360 nm and/or at most 480 nm, i.e. in the blue or near-ultraviolet spectral range. Furthermore, it is possible for the one or at least one of the semiconductor chips to be adapted to generate green light, for example for a pulse measurement of a carrier of the semiconductor component.

According to at least one embodiment, the semiconductor chip or one of the semiconductor chips is a light-emitting diode chip. This means that incoherent radiation is emitted by the semiconductor chip. As an alternative or in addition, the semiconductor chip is or one of the semiconductor chips is configured as a laser diode chip, in particular as a VCSEL chip.

According to at least one embodiment, the reflector inner walls extend in a curved fashion as seen in cross section. This applies, in particular, for the reflector inner walls which are assigned to the lens outer side. At the lens side surfaces, the reflector inner wall may extend in a planar fashion.

According to at least one embodiment, an emission angle range of the semiconductor component and/or of one of the semiconductor chips or of a plurality or of all the semiconductor chips has an aperture angle of at least 5° or 10° or 15° or 25°. As an alternative or in addition, this aperture angle is at most 100° or 80° or 50°. In other words, comparatively directional emission is carried out by the semiconductor component into a small solid angle range. For example, at least 80% or 90% of the radiation emitted by the semiconductor component is emitted into the aforementioned emission angle range.

According to at least one embodiment, the semiconductor component includes one or more first semiconductor chips for emitting first radiation. Furthermore, one or more second semiconductor chips for emitting second radiation are provided. The at least one first and the at least one second semiconductor chip are therefore different to one another and are adapted as light sources for different functions such as an iris scan, face recognition or proximity sensor. The first and second semiconductor chips have, in particular, different optical properties to one another, such as emission spectra, pulse lengths, intensities and/or emission angle ranges.

According to at least one embodiment, the semiconductor chips are arranged in a common plane. This plane may be aligned obliquely with respect to the optical axis of the lens. In a non-limiting embodiment, this plane is parallel to a mounting surface or mounting plane of the semiconductor component.

According to at least one embodiment, the first semiconductor chip is adapted to generate incoherent near-infrared radiation. The first semiconductor chip may therefore be an IRED chip. Furthermore, the second semiconductor chip is adapted to generate visible light such as blue, green, yellow or red light and/or to generate near-infrared radiation. The radiation emitted by the second semiconductor chip is coherent, so that the second semiconductor chip may be a laser. As an alternative, the second semiconductor chip is also an LED chip or an IRED chip.

According to at least one embodiment, the first semiconductor chip is arranged in or on the lens recess and the second semiconductor chip is located outside the lens recess. This means that, in plan view, the lens recess does not overlap with the at least one second semiconductor chip.

According to at least one embodiment, there is no optical separation inside the lens between the first and second semiconductor chips. In other words, it is possible for radiation of the first and second semiconductor chips to mix inside the lens.

According to at least one embodiment, next to the centrally arranged lens recess, the lens includes a secondary plateau. The secondary plateau represents a light entry surface for the second semiconductor chip. The secondary plateau is located outside and, in plan view, next to the lens recess. It is possible for the lens recess and the secondary plateau to touch, or for these to be arranged separated from one another.

According to at least one embodiment, the secondary plateau is flush with the lens inner wall in the direction away from the top surface, so that the lens inner wall extends equally far toward the first semiconductor chip at the secondary plateau and on a side opposite to the secondary plateau. This applies, in particular, with a tolerance of at most 0.2 mm or 0.1 mm and/or with a tolerance of at most 10% or 5% of a total thickness of the lens.

According to at least one embodiment, the secondary plateau is provided with an optically active structure. The optically active structure is for instance a lens such as a convex lens or a concave lens or a freeform lens. As an alternative, the optically active structure is a diffractive optical element, abbreviated to DOE, or roughening.

According to at least one embodiment, the optically active structure is closer to the first and/or second semiconductor chip than the top surface of the lens recess is. This means that the secondary plateau may precede the top surface along the optical axis of the lens.

According to at least one embodiment, a diameter of the secondary plateau, as seen in plan view, is at most 40% or 30% or 10% of a diameter of the lens recess. This applies, in particular, at the bottom side of the lens.

A biometric sensor is furthermore provided. The biometric sensor includes one or more of the optoelectronic semiconductor components as specified in connection with one or more of the embodiments mentioned above. Features of the biometric sensor are therefore also disclosed for the semiconductor component, and vice versa.

In at least one embodiment, the biometric sensor includes an optoelectronic semiconductor component and a detector. The detector is configured as a multichannel detector, for example as a CCD. The detector is adapted to detect radiation emitted by the semiconductor component and reflected by a human eye and/or face. The sensor, which is in particular an iris scanner or a face recognition unit, may furthermore include a data processing unit by means of which identification of the human eye and/or of the face is carried out with the aid of the data obtained by the detector. The detector may be provided with corresponding optics.

For example, the optoelectronic semiconductor component described here is used in a scanner for face recognition or an iris scanner or a pulse measuring instrument, embodied by the biometric sensor.

The optoelectronic semiconductor component and the detector may form a continuous unit which can be mechanically mounted and/or handled together and are located close to one another. As an alternative, the optoelectronic semiconductor component and the detector are arranged separated from one another, for example at a distance from one another of at least 2 cm or 5 cm or 15 cm and/or of at most 0.5 m or 0.2 m, in order to prevent or reduce optical crosstalk from the semiconductor component directly to the detector. In the latter case, the semiconductor component and the detector are, for example, installed as separate subcomponents of the biometric sensor, for instance at different positions in a housing which contains the sensor, for instance at different positions of a smart phone.

According to at least one embodiment, the sensor includes one or more semiconductor components having a first and a second semiconductor chip. The first semiconductor chip may be configured as a light source for iris recognition or for face recognition. The second semiconductor chip is, in particular, a light source for a proximity sensor. A plurality of proximity sensors may be provided, in particular for different distance ranges.

If a plurality of semiconductor chips, in particular functionalized in different ways, are provided, a plurality of detectors may be provided, for example, a detector for each function. For iris recognition or for face recognition, a multichannel detector such as a CCD chip is provided. For the function as a proximity sensor, a single-channel detector may be provided; in the case of a plurality of distance ranges, a separate detector may be provided for each distance range or a single common detector is provided for all the distance ranges.

According to at least one embodiment, the at least one detector or at least one of the detectors is applied in a detector recess of the reflector. In the case of a plurality of detectors, a separate detector recess may be provided per detector. The at least one detector recesses is located next to the reflector recess as seen in plan view, and may be optically isolated therefrom so that the radiation emitted by the semiconductor chip does not reach the detector on a direct path.

BRIEF DESCRIPTION OF THE DRAWINGS

An optoelectronic semiconductor component as described here and iris scanner as described here will be explained in more detail below with reference to the drawings.

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

FIGS. 4, 6 and 7 show schematic sectional representations of embodiments of optoelectronic semiconductor components as described here, FIG. 8 shows a schematic perspective representation of a lens for a semiconductor component as described here, FIG. 9 shows a schematic sectional representation of a lens for a semiconductor component as described here, FIG. 10 shows a schematic sectional representation of one embodiment of an iris scanner.

DETAILED DESCRIPTION

Figure 1:
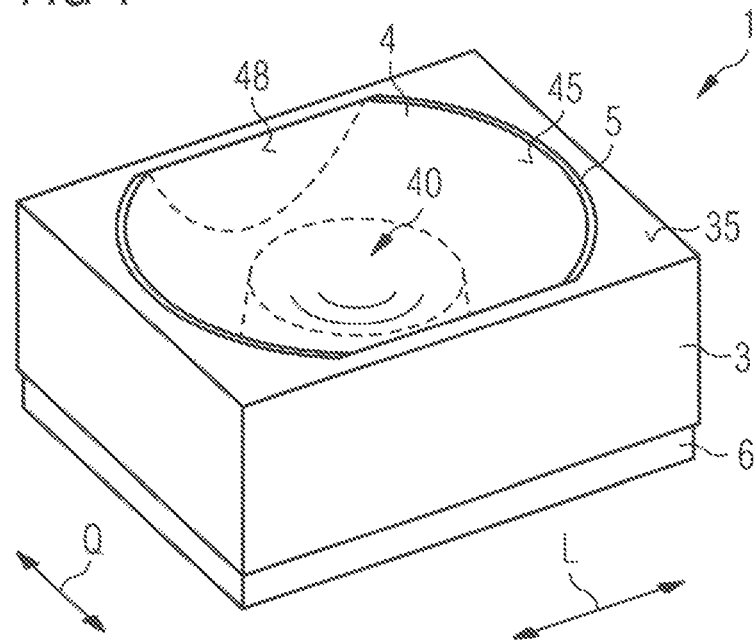
FIG. 1 shows a schematic perspective representation of one embodiment of an optoelectronic semiconductor component as described here.
Figure 2:
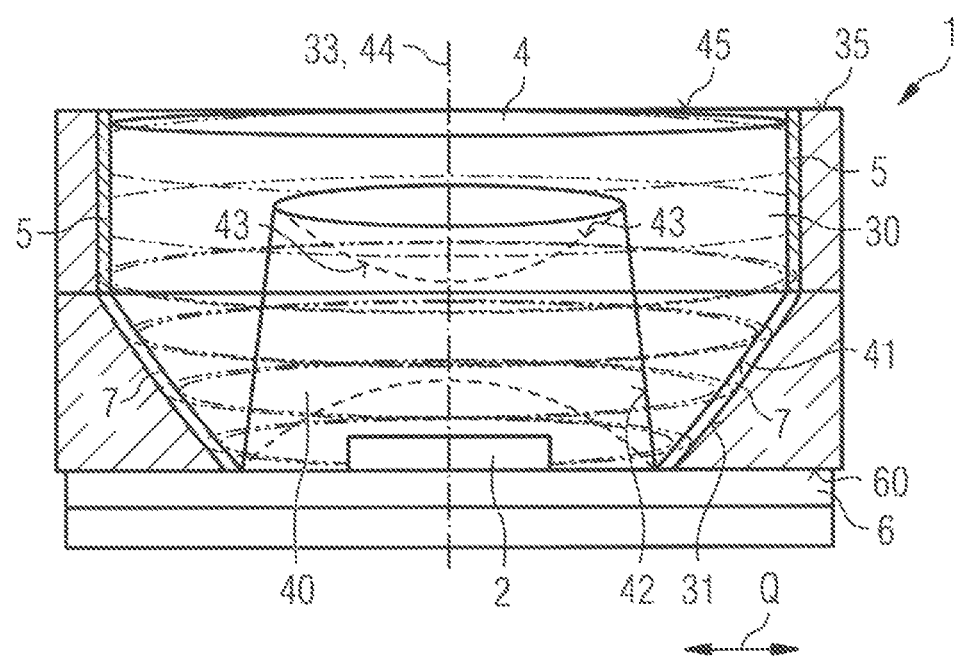
FIGS. 2, 3 and 5 show schematic side views of embodiments of optoelectronic semiconductor components as described here.
Figure 3:
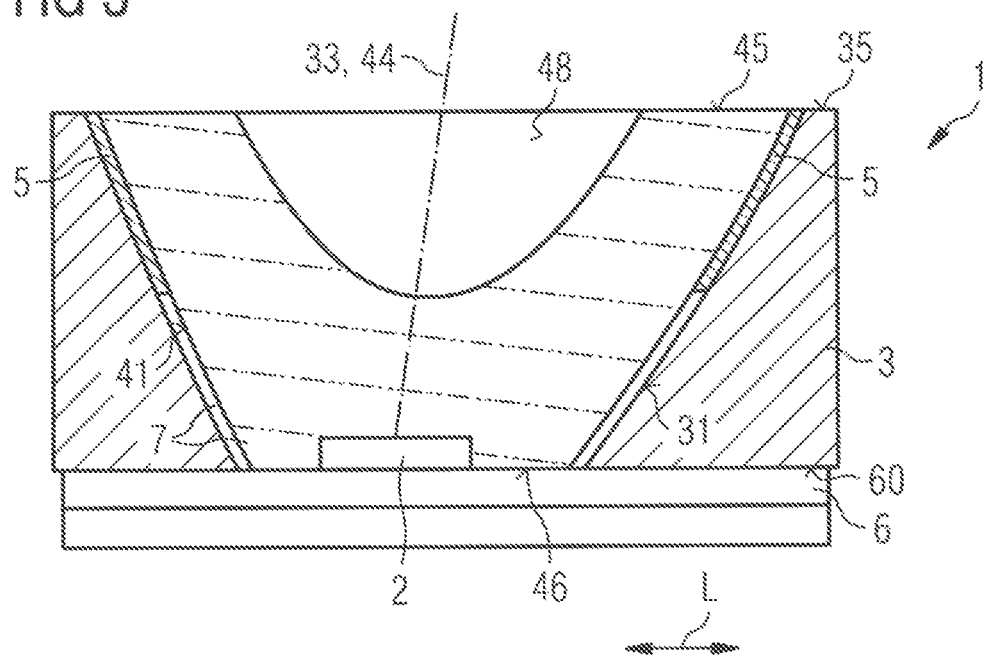

FIGS. 1 to 3 illustrate one embodiment of an optoelectronic semiconductor component 1. The semiconductor component 1 includes a carrier 6 having a mounting plane 60. An optoelectronic semiconductor chip 2 is fastened on the carrier 6. The semiconductor chip 2 is a light-emitting diode chip for emitting radiation with a maximum-intensity wavelength of 810 nm.

A reflector 3, which includes a reflector recess 30, is furthermore applied on the mounting plane 60. The semiconductor chip 2 is applied in the reflector recess 30. The reflector recess 30 is bounded by reflector inner walls 31. The reflector inner wall 31 is coated with a metallic coating for specular reflection of radiation.

There is a lens 4 located in the reflector recess 30. The lens 4 includes a lens recess 40, in which the semiconductor chip 2 is arranged. In this case, the semiconductor chip 2 does not touch the lens 4. A lens upper side 45, facing away from the semiconductor chip 2, is flush with a reflector upper side 35. The reflector upper side 35 and the lens upper side 45 lie in a common plane. Optical axes 33, 44 of the reflector 3 and of the lens 4 are aligned along a transverse axis Q with a smallest extent perpendicularly to the mounting plane 60 and perpendicularly to the reflector upper side 35 and the lens upper side 45, see FIG. 2.

The lens recess 40 includes lens inner walls 42 extending in the direction away from the semiconductor chip 2 to 1 of the optical axis 44. The optical axis 44 passes through a top surface 43 of the lens recess 40, which is convexly curved and is located above the semiconductor chip 2.

Along a longitudinal axis L, which extends perpendicularly to the transverse axis Q, the lens 4 and the reflector 3 are arranged tilted in relation to the mounting plane 60. An angle between the mounting plane 60 and the optical axes 33, 44 is for example 84°, see in particular FIG. 3.

The lens 4 is fastened in the reflector 3 by means of a connecting means 5. The connecting means 5 is bounded to the reflector recess 40. The connecting means 5 extends, starting from the lens upper side 45, for example to at most 20% or 30% along the optical axes 33, 44 in the direction of the semiconductor chip 2.

By the connecting means 5, which is for example a clear silicone, the e.g. injection-molded lens 4 is held at a distance from the reflector 3. This means that the reflector inner walls 31 do not touch the lens outer sides 41. A distance between the reflector inner wall 31 and the lens outer side 41 is constant and does not vary. This distance is, for example, at least 30 μm and/or at most 0.3 mm.

The connecting means 5 covers only a part of the lens outer side 41 and of the reflector inner wall 31. In the areas covered by the connecting means 5, the reflector inner wall 31 is adapted to reflect radiation generated during operation. In the areas not covered by the connecting means 5, the lens outer side 41 is used for total internal reflection of radiation. Between the reflector inner wall 31 and the lens outer side 41, there is therefore for the most part a gap, in particular an air gap 7, see FIGS. 2 and 3.

The lens 4 therefore fills the reflector recess 30 only partly. In this case, the optical axes 33, 44 of the reflector 3 and of the lens 4 are tilted equally in relation to the mounting plane 60, and extend congruently.

A bottom side 46 of the lens 4, which bounds the lens 4 in the direction of the mounting plane 60, does not touch the mounting plane 60, or touches it only in a small region. Since the lens 4 is tilted in relation to the mounting plane 60, and gap 7, which is wedge-shaped as seen in cross section parallel to the longitudinal axis L, is formed on the mounting plane 60 in the direction of the bottom side 46, see FIG. 3.

Optionally, the lens 4 is cut on both sides parallel to the longitudinal axis L, so that planar lens side surfaces 48 are formed parallel to the optical axes 33, 44 and parallel to the longitudinal axis L, see FIGS. 1 and 3. In the direction away from the semiconductor chip 2, the lens side surfaces 48 widen. An edge, facing toward the semiconductor chip 2, of the lens side surfaces 48 is configured approximately parabolically. It is possible that the lens side surfaces 48 do not contribute to the beam shaping, but are merely used as an adhesive bonding surface. In this case, the connecting means 5 is optionally restricted to the lens side surfaces 48. At the lens side surfaces 48, the reflector inner wall 31 may be free of a reflective coating, such as a metal coating, in order to improve attachment of the connecting means 5 to the reflector 3. Because of the lens side surfaces 48, the semiconductor component 1 can be configured more compactly.

Figure 4:
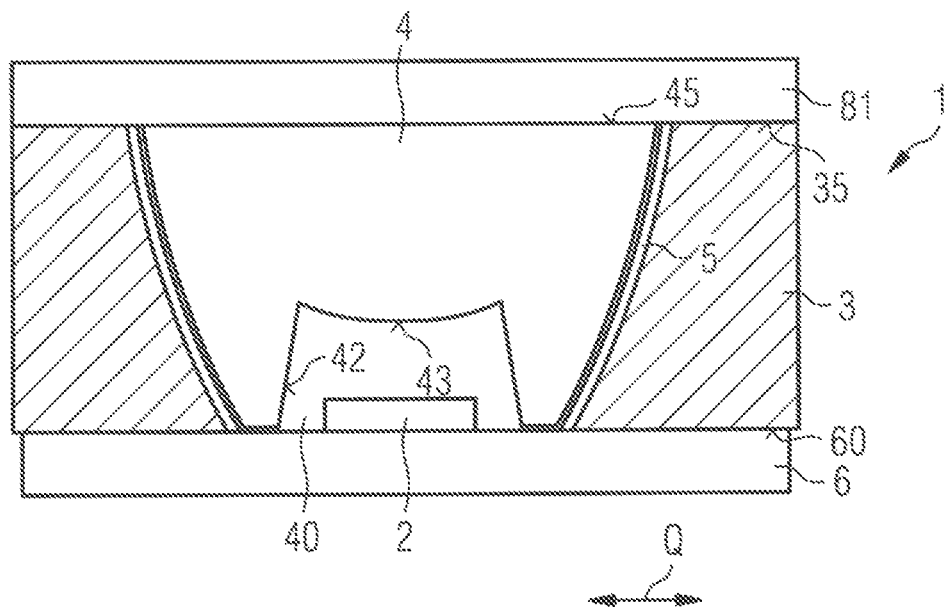

In the embodiment of FIG. 4, it is illustrated that the connecting means 5 may also extend as far as the mounting plane 60. In this case, the lens outer side 41 fully covered by the connecting means 5. The connecting means 5 is restricted to a region close to the lens upper side 45.

Optionally, a cover plate 81 is provided. The cover plate 81 is seated on the reflector upper side 35. Separation of the lens 4 out from the reflector 3 is efficiently prevented by means of the cover plate 81. For example, the cover plate 81 is adhesively bonded onto the lens 4 and onto the reflector 3.

In contrast to FIG. 4, it is furthermore possible for the cover plate 81 and the lens 4 to be configured in one piece and integrally.

Figure 5:
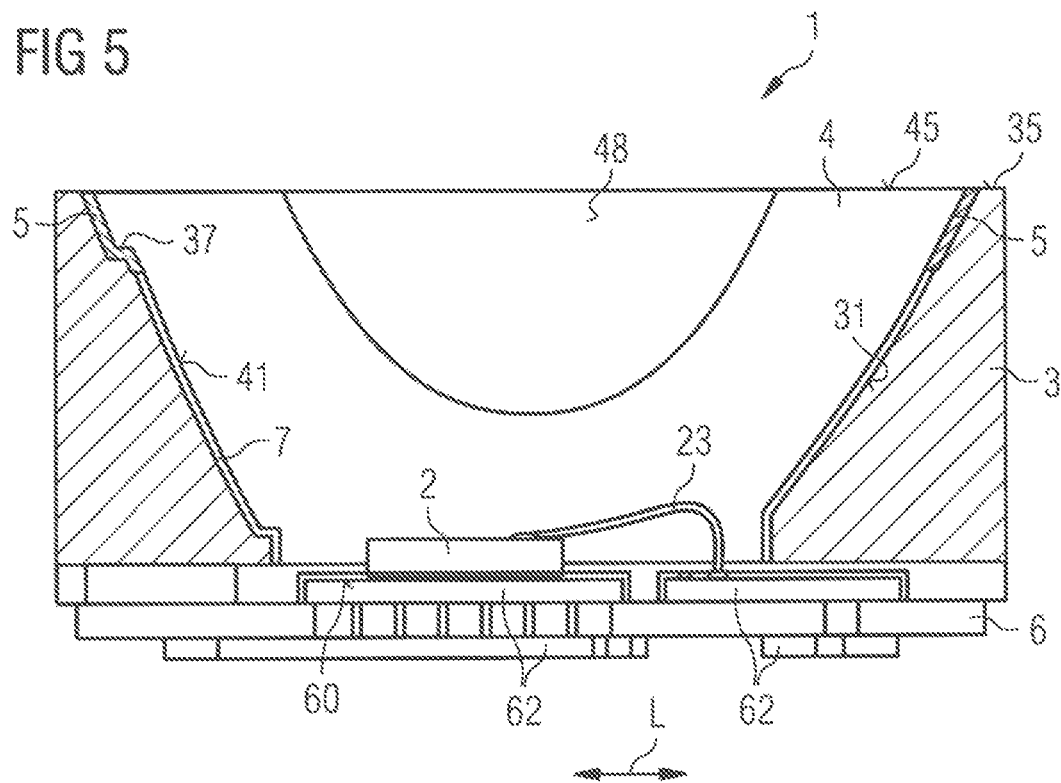

The representation of FIG. 5 corresponds substantially to the representation of FIG. 3. It is furthermore shown that the semiconductor chip 2 may be electrically contacted by means of a bond wire 23. In this case, electrical contact pads 62 are provided on the carrier 6 on both sides, these being electrically connected to one another by means of electrical through-contacts.

As is also possible in all other embodiments, the connecting means 5 is restricted to a region close to the lens upper side 45, so that the connecting means 5 extends around the lens 4 on the lens upper side 45 in a similar way to an O-ring. The lens outer side 41 is therefore almost entirely adapted for total internal reflection of the radiation emitted by the semiconductor chip 2.

On the left-hand side of FIG. 5 it is schematically illustrated that a kink 37 is optionally provided on the lens outer side 41 and on the reflector inner wall 31. The connecting means 5 may be restricted to a region which lies further away from the semiconductor chip 2 than the kink 37. The kink 37 forms a step extending annularly around on the lens outer side 41 and on the reflector inner wall 31. It is possible for the lens outer side 41 above the kink 37 in the direction of the lens upper side 45 to have no optical function or only a secondary optical function, as may likewise apply for the reflector inner wall 31 in this region.

If such a kink is not provided, see FIG. 5, right-hand side, the lens outer side 41 and the reflector inner wall 31 may extend continuously as far as the upper sides 35, 45.

Figure 6:
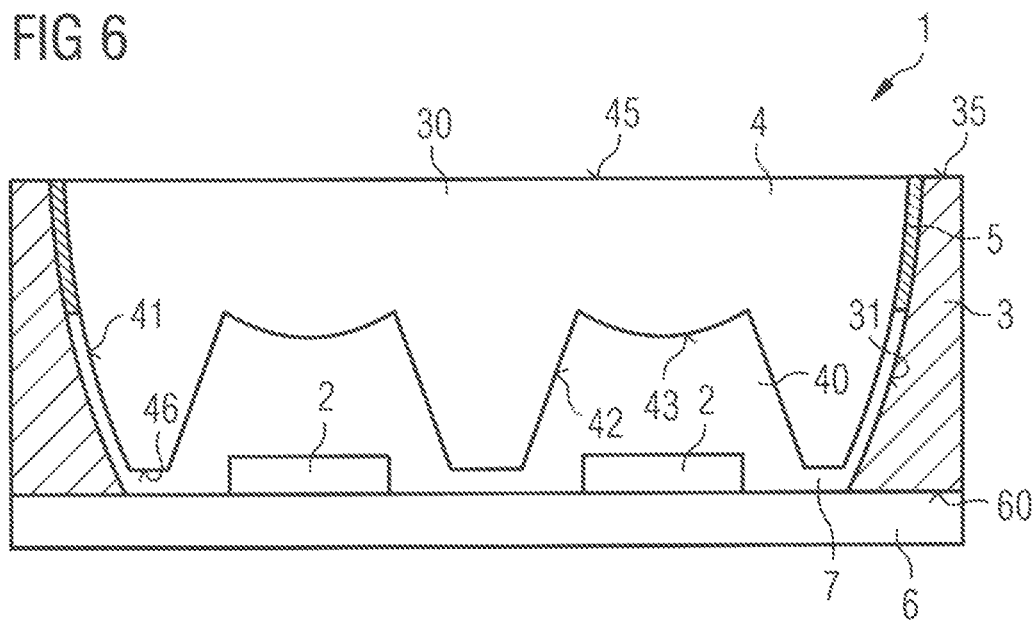

In the embodiment of FIG. 6, it is illustrated that the lens 4 includes a plurality of lens recesses 40, in which one of the semiconductor chips 2 is respectively applied. In this case, the reflector includes only one reflector recess 30, in which the one-piece lens 4 is located. The semiconductor chips 2 may be of the same design, or alternatively different to one another and, for example, configured to emit different spectral ranges.

According to FIG. 7, both a plurality of semiconductor chips 2 and a plurality of lens recesses 40, and also a plurality of reflector recesses 30, are provided. The reflector 3 also extends over a region between neighboring semiconductor chips 2. In this region between the semiconductor chips 2, the connecting means 5 is optionally likewise provided for improved attachment of the lens 4 onto the reflector 3. The lens 4 is again configured in one piece and extends continuously over all the reflector recesses 30, so that the region of the reflector 3 between the semiconductor chips 2 does not reach as far as the reflector upper side 35.

In respect of the configuration of the connecting means 5, of the optical axes 33, 44, of the lens recess 40 and of the lens side surfaces 48, the explanations relating to FIGS. 1 to 5 apply accordingly for FIGS. 6 and 7.

In the perspective representation of the lens 4 in FIG. 8, it is illustrated that a lens plateau 49 is formed on the lens upper side 45. The lens plateau 49 extends away from the lens outer side 41 and is, for example, configured rectangularly as seen in plan view. In a non-limiting embodiment, the lens plateau 8 is formed as a rectangular plane-parallel plate.

In contrast to the representation of FIG. 8, the lens plateau 8 may also protrude beyond the lens side surfaces 48.

The reflector (not shown in FIG. 8) has a negative shape with respect to the lens plateau 49, so that increased attachment between the reflector 3 and the lens 4 may be achieved. The reflector in this case extends annularly around the lens plateau 49, and may be flush with the lens upper side 45 (this is not shown).

In the embodiments of FIGS. 1 to 8, the lens outer side 41 and the reflector inner wall 31 respectively extend in a curved fashion as seen in cross section. In FIG. 9, on the other hand, it is illustrated that the lens outer side 41 extends in a straight line as seen in cross section, as may apply in a similar way for the reflector inner wall. It is furthermore possible for the lens upper side 45 to extend in a curved fashion so that the lens upper side 45, together with the top surface 43, represents a biconvex lens. A corresponding configuration is also possible in all other embodiments.

If the lens upper side 45 extends in a curved fashion, it is nevertheless possible for the lens 4 to be located entirely in the reflector recess (this is not shown in FIG. 9). As an alternative, the reflector may end with the edge between the lens outer side 41 and the lens upper side 45, so that the lens upper side 45 then protrudes beyond the reflector (likewise not shown).

FIG. 10 illustrates a biometric sensor, which is an iris scanner 10. The iris scanner 10 includes one of the semiconductor components 1, for instance as illustrated in connection with FIGS. 1 to 9. The iris scanner 10 furthermore includes a detector 8, for example a CCD element. From the semiconductor component 1, radiation R is emitted in the direction of a human eye 9, reflected there and received by the detector 8. Identification of a user with the aid of the reflective radiation R is therefore possible. The semiconductor component 1 and the detector 8 may be located directly next to one another or, for example, arranged separated from one another by a few cm.

Figure 11:
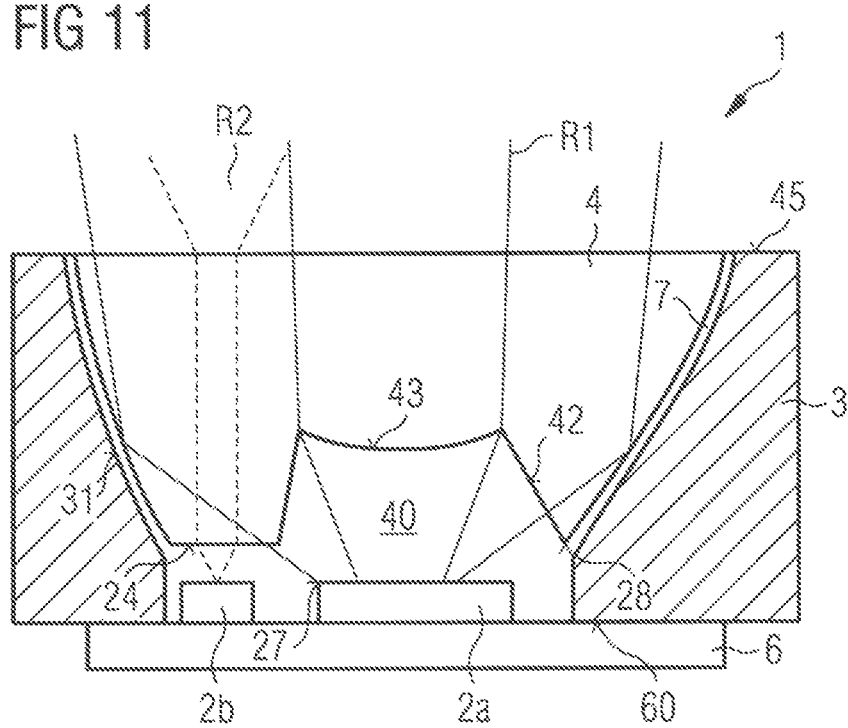
FIGS. 11 and 12 show schematic sectional representations of embodiments of optoelectronic semiconductor components as described here.

In the embodiment of FIG. 11, a first semiconductor chip 2a and a second semiconductor chip 2b are provided. The first semiconductor chip 2a is a light-emitting diode chip for generating near-infrared radiation, abbreviated to IRED chip. The second semiconductor chip 2b is, in particular, a VCSEL, likewise for generating near-infrared radiation. In the case of a VCSEL, the second semiconductor chip 2b includes a field or an array of individual emission surfaces or resonators, which may be driven together or, alternatively, independently of one another. As an alternative to a VCSEL, the second semiconductor chip 2b may be an edge-emitting laser, a DFB laser or a light-emitting diode chip.

For example, the first semiconductor chip 2a is used as a light source for an iris scan or for face recognition. A proximity sensor may be produced using the second semiconductor chip 2b. As well as in all other embodiments, a plurality of second semiconductor chips 2b may be provided, for instance in order to detect different distances of an object from the semiconductor component 1. The semiconductor chips 2a, 2b may be mounted together on the carrier 6. The carrier 6 is a printed circuit board, abbreviated to PCB. Optionally, a driver circuit (not shown) and/or evaluation electronics may be located on the carrier 6.

The first semiconductor chip 2a is located on the lens recess 40, as also in FIGS. 6 and 7, although it may also be located in the lens recess 40. A distance of side edges 27 of an upper side, facing away from the carrier 6, of the semiconductor chip 2 from lower edges 28 of the lens inner wall 42, which delimit the lens 4 from the carrier 6, is as small as possible, for example at most 0.2 mm or 0.1 mm and/or at most 20% or 10% or 5% of a thickness of the lens 4. It is also possible for the side edges 27 of the semiconductor chip 2 and the lower edges 28 of the lens inner wall 42 to almost touch. Furthermore, as for instance in FIG. 2, the side edges 27 of the semiconductor chip 2 may be located in the lens recess 40.

The air gap 7 is provided between the lens 4 and the reflector 3, although it may also be omitted. The same applies for all other embodiments.

Next to the lens recess 40, there is a secondary plateau 24 of the lens 4. The secondary plateau 24 may be shaped in a planar fashion and/or be oriented parallel to the mounting side 60 of the carrier 6. Furthermore, the secondary plateau 24 may extend directly from the lower edges 28 of the lens inner wall 42. In comparison with the lens recess 40, the secondary plateau 24 is small.

The secondary plateau 24 is used as a light entry surface for the second semiconductor chip 2b. Since second radiation R2 of the second semiconductor chip 2b is laser radiation, the second radiation R2 is as far as possible already collimated before entering the lens 4, so that a converging effect due to the lens 4 need not be very pronounced. In particular, the second radiation R2 passes through the lens 4 without coming in contact with the lens outer side 41, except for negligible stray light. This means that the lens 4 affects the second radiation R2 as intended only with the secondary plateau 24 and the lens upper side 45.

As in all other embodiments as well, the first radiation R1, which is generated by the first semiconductor chip 2a, partially reaches the lens outer side 41 and is totally internally reflected there at the air gap 7. If no air gap 7 is provided, specular reflection takes place at the interface between the lens outer side 41 and the reflector inner wall 31, cf. also FIG. 19. This applies, in particular, for the fraction of the first radiation R1 which enters the lens 4 through the lens inner wall 42. The fraction of the first radiation R1 which enters the lens 4 through the top surface 43 is guided directly to the lens upper side 45 and emitted there. The same applies for all other embodiments.

In other regards, the comments in particular regarding FIGS. 1 to 8 apply accordingly for FIG. 11.

Figure 12:
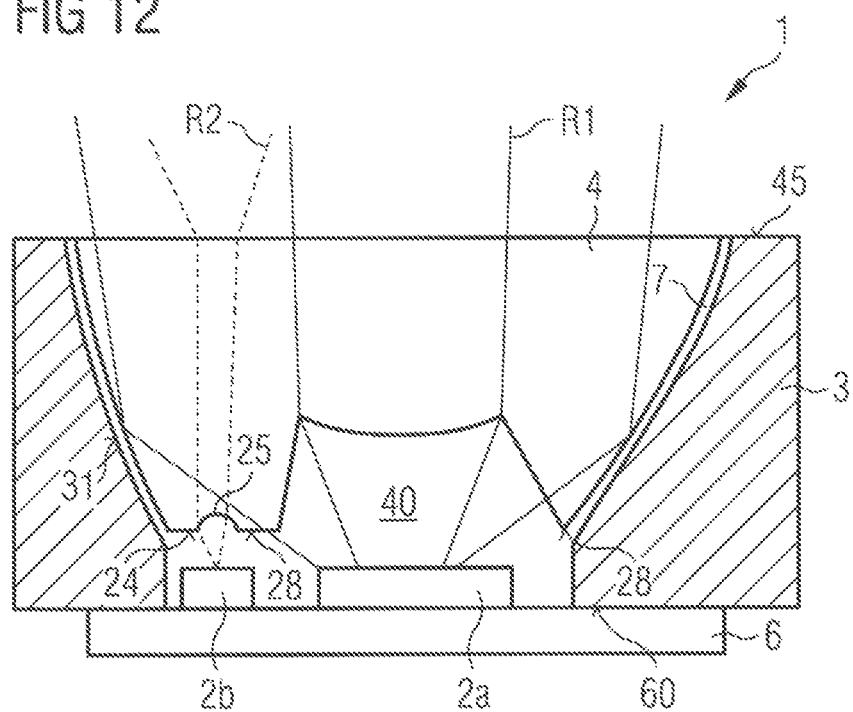

In contrast to FIG. 11, it is shown in FIG. 12 that the secondary plateau 24 is configured not flat but in the shape of a lens, in particular as a concave lens. In contrast to FIG. 12, a convex lens or a freeform lens may also be provided. Furthermore, it is shown in FIG. 12 that, in contrast to FIG. 11, the lower edge 28 of the lens inner wall 42 is configured asymmetrically, so that the lower edge 28 in the direction of the second semiconductor chip 2b is further away from the mounting side 60 than the lower edge 28 in FIG. 12, right.

Figure 13:
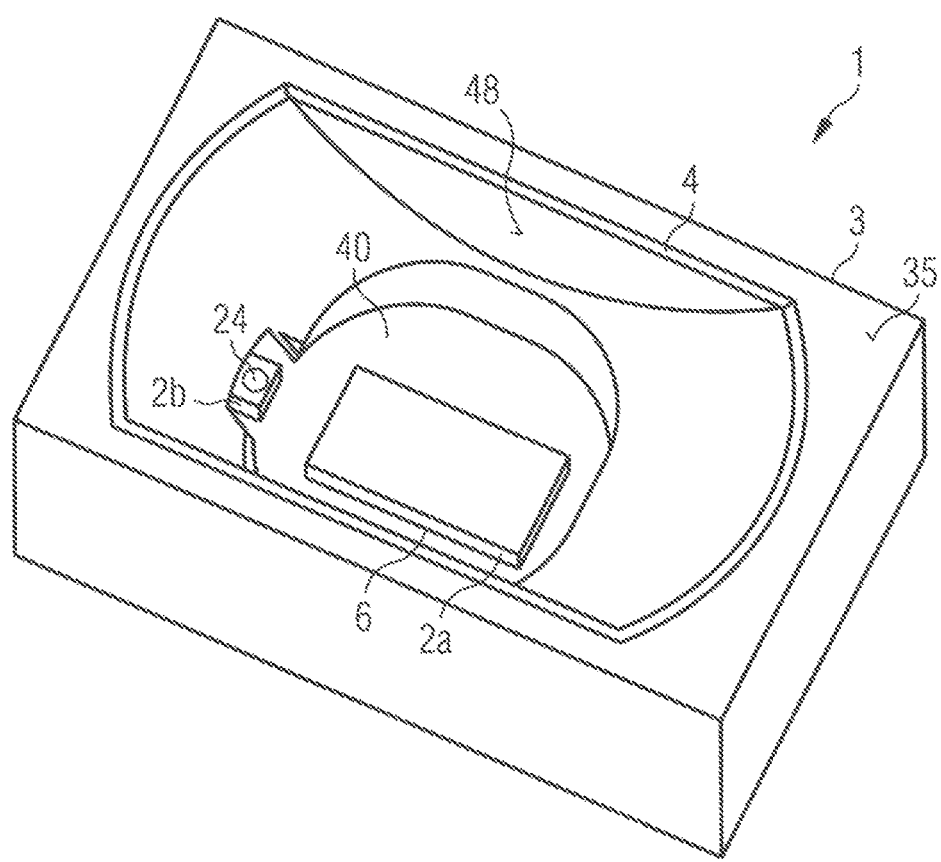
FIG. 13 shows a schematic perspective representation of one embodiment of an optoelectronic semiconductor component as described here.

FIG. 13 three-dimensionally represents the lens 4 of FIG. 12 fitted in the reflector 3. The lens 4 includes the smooth lens side surfaces 48 in order to save space, as particularly in FIGS. 1 and 3, and has a tilted optical axis for the first semiconductor chip 2a. The region around the secondary plateau 24 constitutes only a small part of the lens 4, so that the emission characteristic for the first radiation R1 from the first semiconductor chip 2a is not significantly impeded in comparison with a lens without a secondary plateau.

Figure 14:
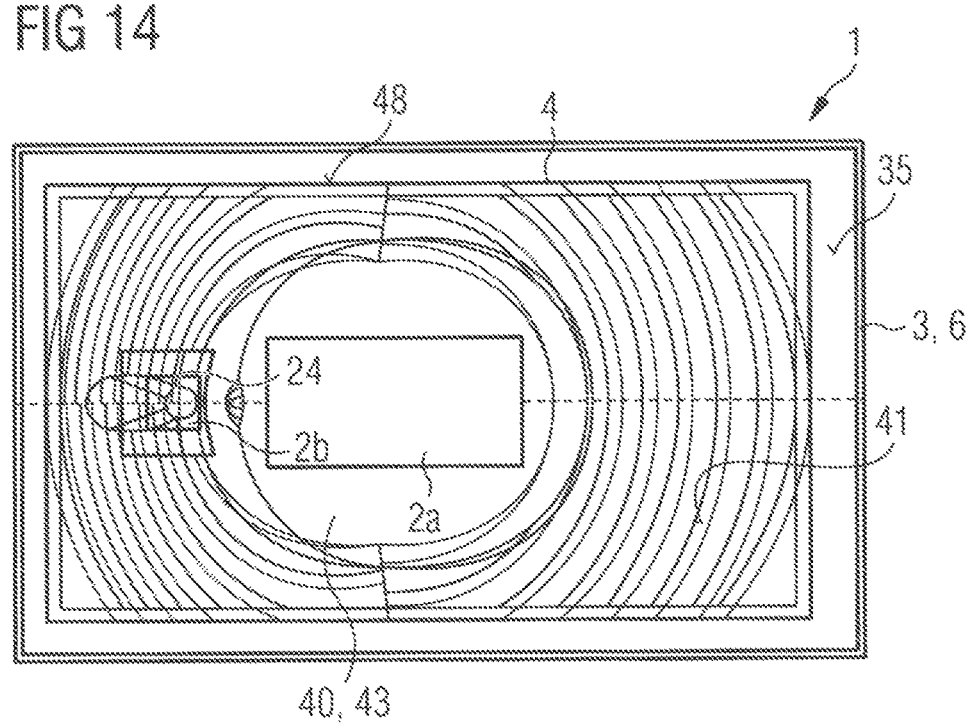
FIG. 14 shows a schematic plan view of one embodiment of an optoelectronic semiconductor component as described here.

Furthermore, FIG. 14 represents a plan view of the lens 4 of FIG. 12. It may be seen, in particular, that in FIG. 14, left, because of the tilting of the optical axis, a swipe of the lens outer side 41 is greater than on the right-hand side in FIG. 14. The second semiconductor chip 2b is therefore located on the side of the first semiconductor chip 2a at which the average slope of the lens outer side 41 is greatest. This means that the optical axis of the lens 4 for the radiation R1 of the first semiconductor chip 2a may point away from the second semiconductor chip 2b, i.e. point toward the right in FIG. 14.

The first semiconductor chip 2a may be shaped rectangularly as seen in plan view and be oriented with longitudinal sides parallel to the lens side surfaces 48. Shorter transverse sides extend parallel to the second semiconductor chip 2b, which may be shaped squarely in plan view.

Figure 15:
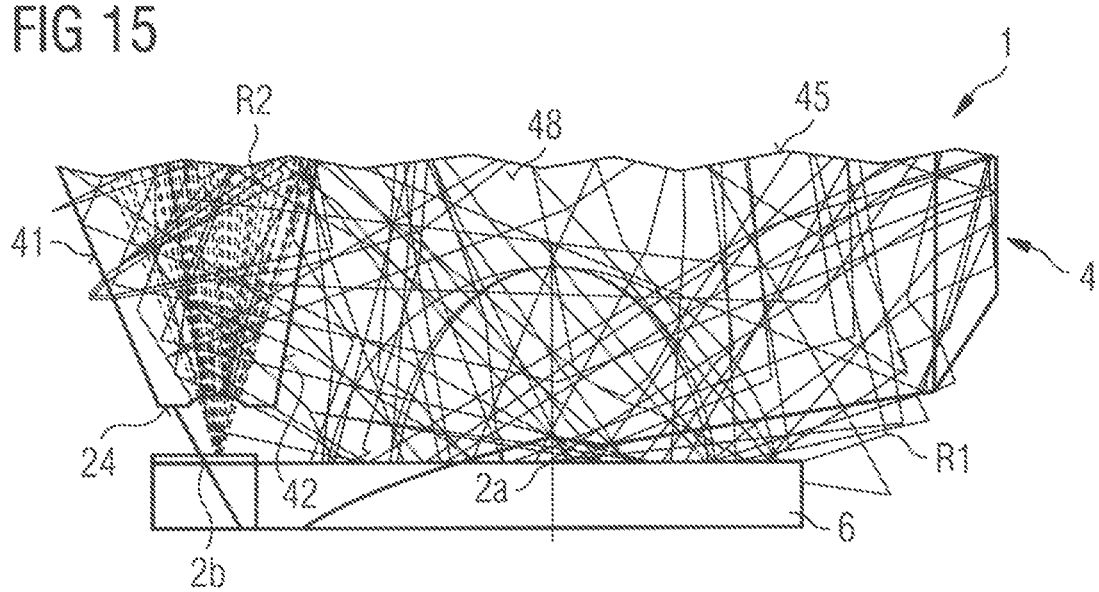
FIG. 15 shows a schematic representation of ray paths in one embodiment of an optoelectronic semiconductor component as described here.

Furthermore, with the aid of exemplary ray paths, FIG. 15 schematically illustrates emission of the radiation R1, R2 by the two semiconductor chips 2a, 2b inside the lens 4. It may be seen that the first semiconductor chip 2a has a Lambertian or substantially a Lambertian emission characteristic, i.e. it emits almost over a solid angle range of $2\pi$.

A part of the first radiation R1 therefore also reaches the carrier 6 because of reflections, but the great majority passes through the lens inner wall 42 to the lens outer side 42 and then to the lens upper side 45, or through the top surface 43 directly to the lens upper side 45. On the other hand, the second radiation R2 is already emitted highly directionally by the second semiconductor chip 2b and passes from the secondary plateau 24 directly to the lens upper side 45. To this end, the second semiconductor chip 2b may include collimation optics.

Figure 16:
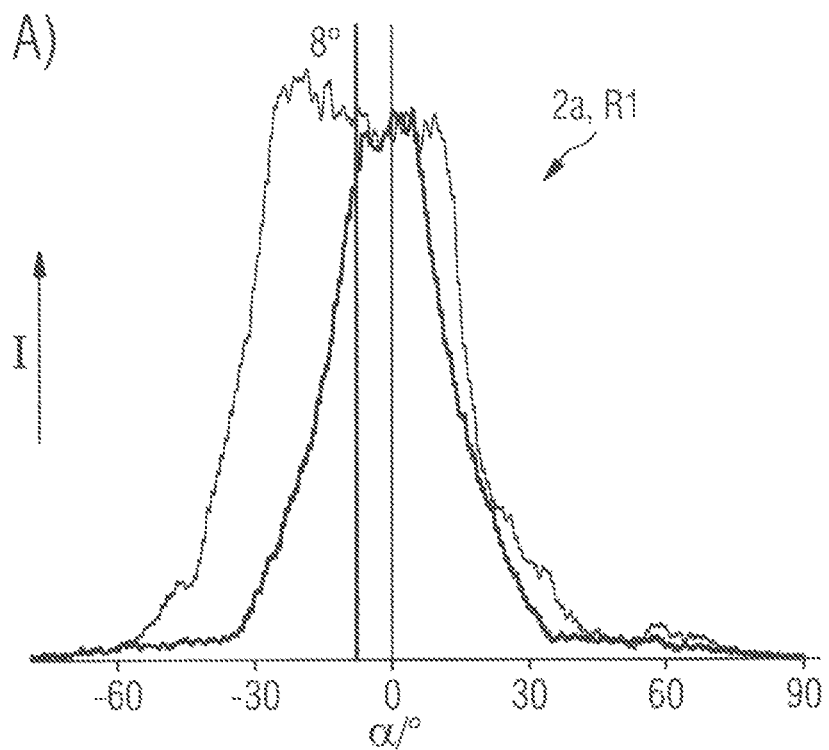
FIG. 16 shows a schematic representation of an emission characteristic of one embodiment of an optoelectronic semiconductor component as described here.
Figure 16:
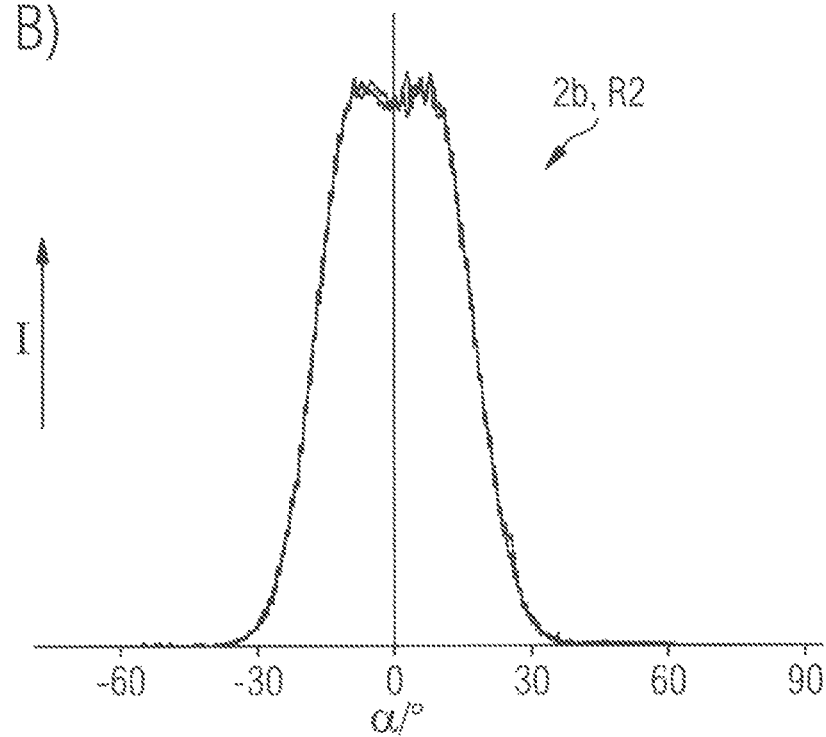

FIG. 16 shows the associated emission characteristic, i.e. an intensity I in arbitrary units as a function of an emission angle $\alpha$. In FIG. 16A, it may be seen that the emission by the first semiconductor chip 2a is tilted in one direction, for example with a tilt angle of 8°. On the other hand, the second radiation R2 of the second semiconductor chip 2b is emitted perpendicularly to the mounting side 60 and therefore without a tilt.

An emission angle range for the second radiation R2 is approximately 48°, full width at half maximum, abbreviated to FWHM. This value for the first radiation R1 is approximately 62° along the tilt direction and approximately 38° in the direction perpendicular thereto. This means that the first radiation R1 can illuminate an elliptical region and the second radiation R2 can illuminate a circular region. Along at least one direction, the first radiation R1 may be collimated more greatly than the second radiation R2, and along at least one other direction, on the other hand, collimated more weakly than the first radiation R1.

Figure 17:
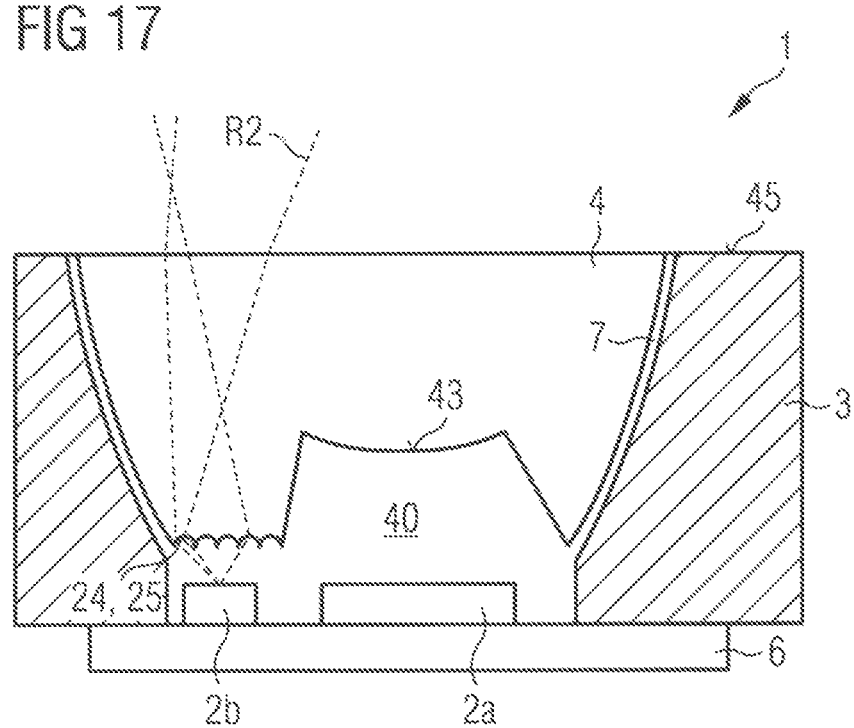
FIG. 17 shows a schematic sectional representation of one embodiment of an optoelectronic semiconductor component as described here.

In the embodiment of FIG. 17, the secondary plateau 24 is provided with a diffractive optical element, abbreviated to DOE, as an optically active structure 25 in order to achieve widening of the second radiation R2. As an alternative, roughening may be provided on the secondary plateau 24. In a non-limiting embodiment, an alternative or additional roughening on the lens upper side 45 may be present.

In other regards, the embodiments in particular regarding FIGS. 11 to 16 apply accordingly for FIG. 17.

Figure 18:
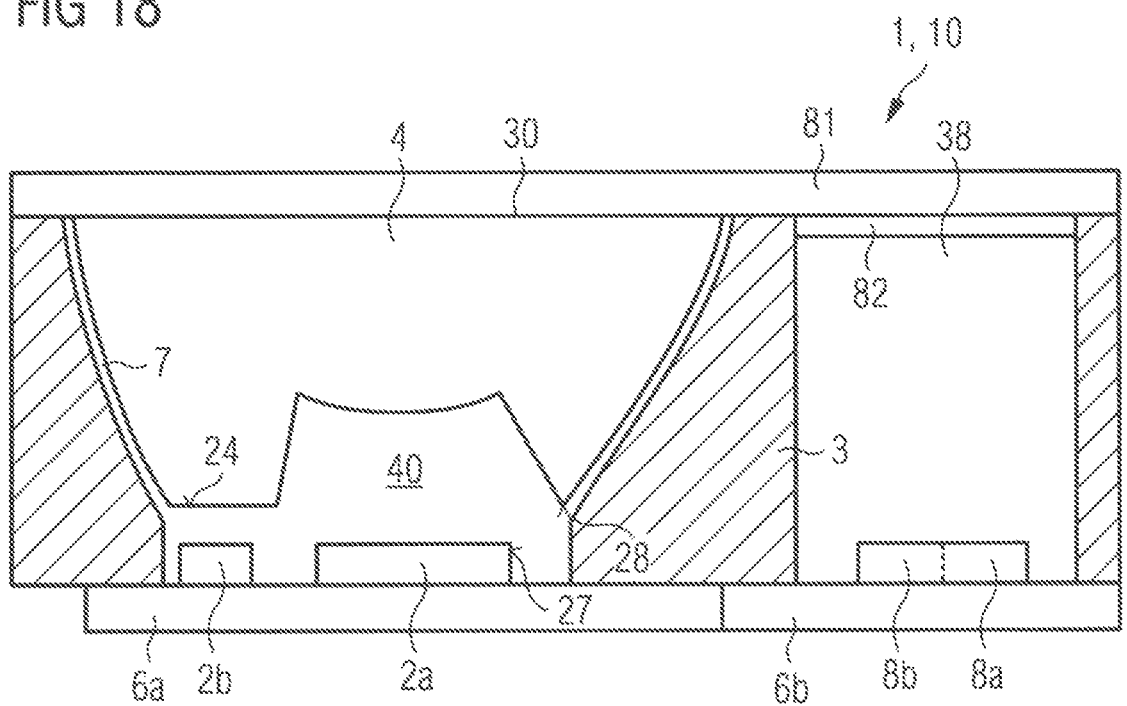
FIGS. 18 and 19 show schematic sectional representations of embodiments of biometric sensors having optoelectronic semiconductor components as described here.

FIG. 18 represents a further embodiment of the biometric sensor 10. The semiconductor chips 2a, 2b, the lens 4 and the reflector recess 30 are configured as explained in FIGS. 11 to 17, particularly as in FIG. 11. In addition, the reflector 3 includes a detector recess 38 in which there are two detectors 8a, 8b, or alternatively only one detector. The detectors 8a, 8b are, for example, a CCD chip and a photodiode. By a material of the reflector 3, optical shielding of the semiconductor chips 2a, 2b from the detectors 8a, 8b takes place. In this case, the detectors 8a, 8b may be applied on a different carrier 6b than the semiconductor chips 2a, 2b, which are located on the carrier 6a.

In order to fasten the lens 4 in the reflector recess 30, a cover plate 81 is optionally provided, as is also possible in all other embodiments. The cover plate 81 may cover the entire reflector 3, and therefore also the detector recess 38. According to FIG. 18, the cover plate 81 is configured continuously. As an alternative, there may also be optical isolation in the cover plate 81 located between the reflector recess 30 and the detector recess 38, or two cover plates are provided.

It is possible for the cover plate 81 to be transparent only for near-infrared radiation and/or only for radiation which is generated by the semiconductor chips 2a, 2b. Furthermore, a coating 82 may optionally be provided. The coating 82 may be restricted to the detector recess 38 or may also be provided on the reflector recess 30. For example, the coating 82 is an optical filter layer or an antireflection layer.

Furthermore, in contrast to FIG. 18 it is possible for the cover plate 81 not to be a plane-parallel plate, but to include structuring, for example roughening or, in the region of the detector recess 38 and/or of the reflector recess 30, a lens shape such as a Fresnel lens. The detector recess 38 is evacuated or filled with gas, although it may also be filled partially or fully with encapsulation (not shown).

Figure 19:
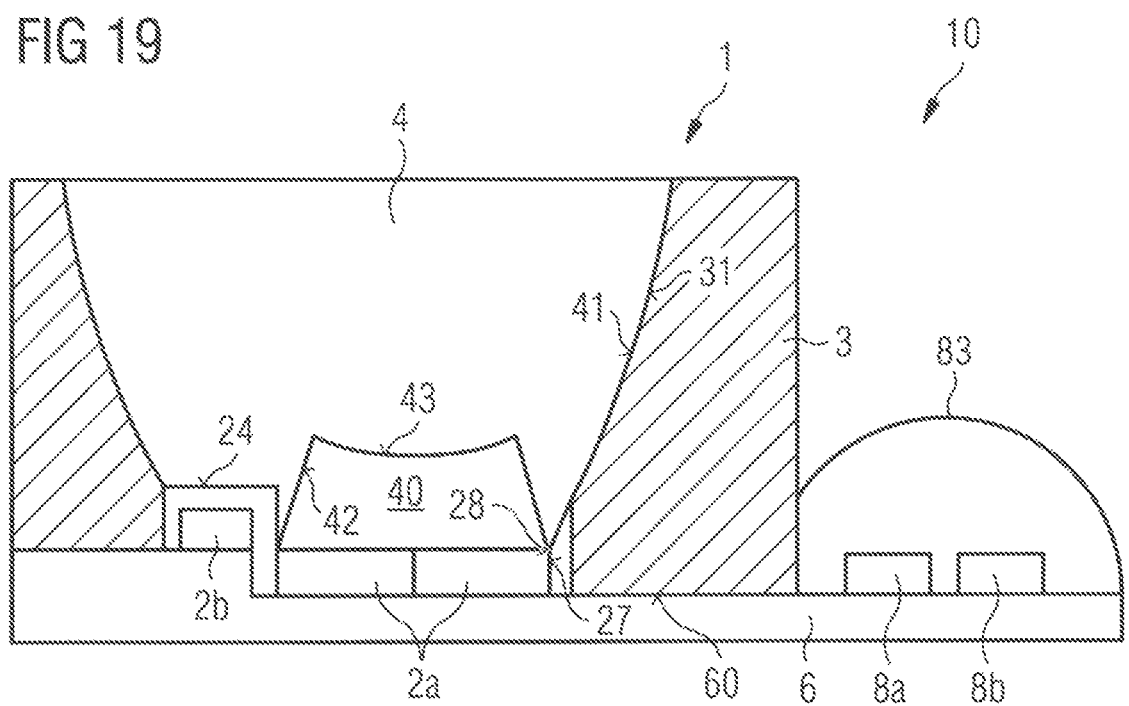

In FIG. 19, it is illustrated that no air gap is provided between the lens 4 and the reflector 3 at the lens outer side 41. Furthermore, a plurality of first semiconductor chips 2a may be provided, which are for example arranged densely in a field. As a further option, the semiconductor chips 2a, 2b are located in different planes on the carrier 6, so that the mounting plane 60 extends in a stepped fashion.

Furthermore, the secondary plateau 24 may lie further away from the carrier 6 than the lower edge 28 of the lens inner wall 42 does, so that the secondary plateau 24 is set back relative to the lower edge 28. The lower edge 28 may therefore extend circularly or as an ellipse around the first semiconductor chip 2a as seen in plan view. In this case, a distance between the second semiconductor chip 2b and the secondary plateau 24 may be adjusted by means of the optional step in the mounting plane 60.

Furthermore, the detector or detectors 8a, 8b may be applied outside the reflector 3 on the carrier 6, for example in the same plane as the first semiconductor chip 2a. Encapsulation 83 is optionally provided, which covers the detectors 8a, 8b. The encapsulation 83 may be configured in the shape of a lens and/or contain an optical filter material.

The variants explained in FIG. 19 may also apply in all other embodiments.

The parts shown in the figures in each case follow one another directly in the order indicated, unless otherwise indicated. Layers which do not touch in the figures are separated from one another. If lines are shown parallel to one another, the corresponding surfaces are likewise aligned parallel with one another. Likewise, unless otherwise indicated, the relative positions of the parts shown with respect to one another are correctly reproduced in the figures.

The invention described here is not restricted by the description with the aid of the embodiments. Rather, the invention includes any new feature and any combination of features, which includes in particular any combination of features in the patent claims, even if this feature or this combination per se is not explicitly indicated in the patent claims or embodiments.

LIST OF REFERENCES 1 optoelectronic semiconductor component
2 optoelectronic semiconductor chip
23 bond wire
24 secondary plateau 25 optically active structure
27 side edge of an upper side of the semiconductor chip
28 lower edge of the lens
3 reflector
30 reflector recess
31 reflector inner wall
33 optical axis of the reflector
35 reflector upper side
37 kink
38 detector recess
4 lens
40 lens recess
41 lens outer side
42 lens inner wall
43 top surface
44 optical axis of the lens
45 lens upper side
46 bottom side
48 lens side surface
49 lens plateau
5 connecting means
6 carrier
60 mounting plane
62 electrical contact pad
7 air gap
81 cover plate
82 coating
83 encapsulation
8 detector
9 human eye
10 biometric sensor/iris scanner
I intensity in arbitrary units
L longitudinal axis
Q transverse axis
R radiation
α emission angle in °

The invention claimed is:

1. An optoelectronic semiconductor component, comprising:
at least one optoelectronic semiconductor chip;
a reflector having a reflector recess, in which the at least one optoelectronic semiconductor chip is arranged;
a lens fully located in the reflector recess and which has a lens recess in or on which the at least one optoelectronic semiconductor chip is arranged; and
a connecting layer for fastening the lens on the reflector;
wherein:
the lens comprises a lens outer side facing toward a reflector inner wall of the reflector recess;
a gap between the reflector and the lens is filled only partially with the connecting layer;
the lens recess is free of the connecting layer, and the at least one optoelectronic semiconductor chip does not touch the connecting layer;
an optical axis of the lens is arranged obliquely with respect to a mounting plane of the at least one optoelectronic semiconductor chip; and
the lens recess is shaped rotationally symmetrically about the optical axis of the lens; and
the at least one optoelectronic semiconductor chip does not touch the lens.

2. The optoelectronic semiconductor component as claimed in claim 1,
wherein the connecting layer is located at least partly between the reflector inner wall and the lens outer side, and/or the at least one optoelectronic semiconductor chip is located partially or fully in the lens recess.

3. The optoelectronic semiconductor component as claimed in claim 1,
wherein:
the connecting layer covers the lens outer side to at most 30%, and wherein areas of the lens outer side free of the connecting layer are configured for total internal reflection of radiation generated by the at least one optoelectronic semiconductor chip during operation,
in areas of the lens outer side covered by the connecting layer, the reflector inner wall is configured for specular reflection of the radiation generated by the at least one optoelectronic semiconductor chip during operation,
the reflector inner wall is separated from the lens outer side, and
a refractive index difference between the lens and the connecting layer is at most 0.2, expressed in terms of a temperature of 300 K and a maximum-intensity wavelength of the radiation generated by the at least one optoelectronic semiconductor chip during operation.

4. The optoelectronic semiconductor component as claimed in claim 1,
wherein a bottom side of the lens is aligned perpendicularly to the optical axis of the lens and therefore obliquely with respect to the mounting plane,
wherein the gap is wedge-shaped as seen in cross section between the mounting plane and the bottom side.

5. The optoelectronic semiconductor component as claimed in claim 1,
wherein a lens upper side, facing away from the mounting plane, of the lens and a reflector upper side of the reflector extend in a planar fashion, flush with one another and parallel to the mounting plane.

6. The optoelectronic semiconductor component as claimed in claim 1,
wherein the lens recess comprises a frustoconical lens inner wall and a convexly curved top surface arranged over the at least one optoelectronic semiconductor chip,
wherein a distance between the top surface and the at least one optoelectronic semiconductor chip is between 0.5 times and two times a diagonal length of the at least one optoelectronic semiconductor chip, inclusive.

7. The optoelectronic semiconductor component as claimed in claim 1,
wherein the lens is shaped asymmetrically as seen in plan view, and in plan view has a greatest extent along a longitudinal axis and a smallest extent along a transverse axis,
wherein the longitudinal axis is oriented perpendicularly to the transverse axis.

8. The optoelectronic semiconductor component as claimed in claim 1,
wherein the lens comprises planar lens side surfaces on a side facing away from the at least one optoelectronic semiconductor chip, which are oriented parallel to one another and to the optical axis of the lens, and which extend in a round fashion as seen in side view and widen in the direction away from the at least one optoelectronic semiconductor chip.

9. The optoelectronic semiconductor component as claimed in claim 1,
wherein the connecting layer is fully located inside the reflector recess,
wherein all the reflector inner walls extend in a curved fashion as seen in cross section, and
wherein an emission angle range of the semiconductor component has an aperture angle of between 15° and 50° inclusive.

10. The optoelectronic semiconductor component as claimed in claim 1,
wherein the at least one optoelectronic semiconductor chip is configured to emit radiation having a maximum-intensity wavelength of between 750 nm and 980 nm inclusive,
wherein the at least one optoelectronic semiconductor chip is a light-emitting diode chip.

11. The optoelectronic semiconductor component as claimed in claim 1,
wherein the at least one optoelectronic semiconductor chip comprises at least one first semiconductor chip and one second semiconductor chip, which are configured for different functions and have different emission spectra to one another,
wherein the at least one first semiconductor chip and the second chip are arranged in a common plane, and
wherein the lens outer side is configured in places for total internal reflection and in places for specular or diffuse reflection of the radiation generated by the first semiconductor chip during operation, and the radiation generated by the second semiconductor chip does not reach the lens outer side.

12. The optoelectronic semiconductor component as claimed in claim 11,
wherein the first semiconductor chip is configured to generate incoherent near-infrared radiation and the second semiconductor chip is configured to generate red or near-infrared coherent radiation,
wherein the first semiconductor chip is located in or on the lens recess and the second semiconductor chip is arranged outside the lens recess, and
wherein there is no optical separation inside the lens between the first semiconductor chip and the second chip.

13. The optoelectronic semiconductor component as claimed in claim 11,
wherein next to the centrally arranged lens recess, the lens comprises a secondary plateau which represents a light entry surface for the second semiconductor chip,
wherein the secondary plateau is flush with the lens inner wall in the direction away from the top surface, so that the lens inner wall extends equally far toward the first semiconductor chip at the secondary plateau and on a side opposite to the secondary plateau, with a tolerance of at most 0.2 mm.

14. The optoelectronic semiconductor component as claimed in claim 13,
wherein the secondary plateau is provided with an optically active structure,
wherein the optically active structure is a lens, roughening and/or a diffractive optical element,
wherein the optically active structure is closer to the first semiconductor chip and the second semiconductor chip than the top surface, and
wherein a diameter of the secondary plateau is at most 30% of a diameter of the lens recess.

15. A biometric sensor comprising:
at least one optoelectronic semiconductor component as claimed in claim 1, and
at least one detector configured to detect radiation emitted by the at least one optoelectronic semiconductor component and reflected at a body to be detected.

16. The biometric sensor as claimed in claim 15,
wherein the body to be detected is at least one human eye and/or one human face.

17. A biometric sensor comprising:
at least one semiconductor component as claimed in claim 11, and
at least one detector configured to detect radiation emitted by the at least one semiconductor component and reflected at a body to be detected,
wherein the at least one second semiconductor chip is a light source for a proximity sensor, and
wherein the at least one detector is located in a detector recess of the reflector, and the detector recess lies next to the reflector recess as seen in plan view.

18. An optoelectronic semiconductor component comprising:
a plurality of optoelectronic semiconductor chips of the same type;
a reflector having a reflector recess, in which the plurality of optoelectronic semiconductor chips are arranged;
a lens fully located in the reflector recess where the lens has a plurality of lens recesses in or on which the plurality of optoelectronic semiconductor chips are arranged; wherein
precisely one lens is provided; and wherein the lens recesses are assigned uniquely to the plurality of the optoelectronic semiconductor chips; and
a connecting layer for fastening the lens on the reflector; wherein:
the lens comprises a lens outer side facing toward a reflector inner wall of the reflector recess;
a gap between the reflector and the lens is filled only partially with the connecting layer; and
the plurality of optoelectronic semiconductor chips does not touch the lens.

19. An optoelectronic semiconductor component comprising:
at least one optoelectronic semiconductor chip;
a reflector having a reflector recess, in which the at least one optoelectronic semiconductor chip is arranged,
a lens fully located in the reflector recess and which has a lens recess in or on which the at least one optoelectronic semiconductor chip is arranged; wherein the lens comprises a lens plateau on a side facing away from the at least one optoelectronic semiconductor chip; wherein the lens plateau is a polygon as seen in plan view and is configured to anchor the lens to the reflector; and
a connecting layer for fastening the lens on the reflector; wherein:
the lens comprises a lens outer side facing toward a reflector inner wall of the reflector recess;
a gap between the reflector and the lens is filled only partially with the connecting layer; and
the at least one optoelectronic semiconductor chip does not touch the lens.

20. An optoelectronic semiconductor component, comprising:
at least one optoelectronic semiconductor chip;
a reflector having a reflector recess, in which the at least one optoelectronic semiconductor chip is arranged;
a lens fully located in the reflector recess and which has a lens recess in or on which at least one optoelectronic semiconductor chip is arranged; and
a connecting layer for fastening the lens on the reflector; wherein:
the lens comprises a lens outer side facing toward a reflector inner wall of the reflector recess;
a gap between the reflector and the lens is filled only partially with the connecting layer;

the at least one optoelectronic semiconductor chip does not touch the lens;

the connecting layer covers the lens outer side to at most 30%, and wherein areas of the lens outer side free of the connecting layer are configured for total internal reflection of radiation generated by the at least one optoelectronic semiconductor chip during operation;

in areas of the lens outer side covered by the connecting layer, the reflector inner wall is configured for specular reflection of the radiation generated by the at least one optoelectronic semiconductor chip during operation;

the reflector inner wall is separated from the lens outer side; and a refractive index difference between the lens and the connecting layer is at most 0.05, expressed in terms of a temperature of 300 K and a maximum-intensity wavelength of the radiation generated by the at least one optoelectronic semiconductor chip during operation.

21. An optoelectronic semiconductor component, comprising:
at least one optoelectronic semiconductor chip;
a reflector having a reflector recess, in which the at least one optoelectronic semiconductor chip is arranged;
a lens fully located in the reflector recess and which has a lens recess in or on which at least one optoelectronic semiconductor chip is arranged; and
a connecting layer for fastening the lens on the reflector; wherein:
the lens comprises a lens outer side facing toward a reflector inner wall of the reflector recess;
the lens recess comprises a frustoconical lens inner wall and a convexly curved top surface arranged over the at least one optoelectronic semiconductor chip;
a distance between the top surface and the at least one optoelectronic semiconductor chip is between 0.5 times and two times a diagonal length of the at least one optoelectronic semiconductor chip, inclusive; and
a gap between the reflector and the lens is filled only partially with the connecting layer;
the at least one optoelectronic semiconductor chip does not touch the lens.

22. An optoelectronic semiconductor component, comprising:
at least one optoelectronic semiconductor chip;
a reflector having a reflector recess, in which the at least one optoelectronic semiconductor chip is arranged;
a lens fully located in the reflector recess and which has a lens recess in or on which at least one optoelectronic semiconductor chip is arranged; and
a connecting layer for fastening the lens on the reflector; wherein:
the lens comprises a lens outer side facing toward a reflector inner wall of the reflector recess;
a gap between the reflector and the lens is filled only partially with the connecting layer;
the at least one optoelectronic semiconductor chip does not touch the lens;
the lens is shaped asymmetrically as seen in plan view, and in plan view has a greatest extent along a longitudinal axis and a smallest extent along a transverse axis; and
the longitudinal axis is oriented perpendicularly to the transverse axis.

23. An optoelectronic semiconductor component, comprising:
at least one optoelectronic semiconductor chip;
a reflector having a reflector recess, in which the at least one optoelectronic semiconductor chip is arranged;
a lens fully located in the reflector recess and which has a lens recess in or on which at least one optoelectronic semiconductor chip is arranged; and
a connecting layer for fastening the lens on the reflector; wherein:
the lens comprises a lens outer side facing toward a reflector inner wall of the reflector recess;
a gap between the reflector and the lens is filled only partially with the connecting layer;
the at least one optoelectronic semiconductor chip does not touch the lens; and
the lens comprises planar lens side surfaces on a side facing away from the at least one optoelectronic semiconductor chip, which are oriented parallel to one another and to the optical axis of the lens, and which extend in a round fashion as seen in side view and widen in the direction away from the at least one optoelectronic semiconductor chip.

24. An optoelectronic semiconductor component, comprising:
at least one optoelectronic semiconductor chip;
a reflector having a reflector recess, in which the at least one optoelectronic semiconductor chip is arranged;
a lens fully located in the reflector recess and which has a lens recess in or on which at least one optoelectronic semiconductor chip is arranged; and
a connecting layer for fastening the lens on the reflector; wherein:
the lens comprises a lens outer side facing toward a reflector inner wall of the reflector recess;
a gap between the reflector and the lens is filled only partially with the connecting layer;
the at least one optoelectronic semiconductor chip does not touch the lens;
the at least one optoelectronic semiconductor chip comprises at least one first semiconductor chip and one second semiconductor chip, which are configured for different functions and have different emission spectra to one another;
the at least one first semiconductor chip and the second chip are arranged in a common plane; and
the lens outer side is configured in places for total internal reflection and in places for specular or diffuse reflection of the radiation generated by the first semiconductor chip during operation, and the radiation generated by the second semiconductor chip does not reach the lens outer side.

* * * * *